(12) United States Patent
Surakitbovorn et al.

(10) Patent No.: US 11,411,536 B2
(45) Date of Patent: Aug. 9, 2022

(54) POWER AMPLIFIER WITH EACH OF MULTIPLE IN-PARALLEL CIRCUITS HAVING POWER AMPLIFICATION AND IMMITTANCE CONVERSION

(71) Applicant: The Board of Trustees of the Leland Stanford Junior University, Stanford, CA (US)

(72) Inventors: Kawin Surakitbovorn, East Palo Alto, CA (US); Juan Rivas-Davila, Palo Alto, CA (US); Lei Gu, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 72 days.

(21) Appl. No.: 16/932,361

(22) Filed: Jul. 17, 2020

(65) Prior Publication Data
US 2021/0021236 A1      Jan. 21, 2021

Related U.S. Application Data

(60) Provisional application No. 62/875,344, filed on Jul. 17, 2019.

(51) Int. Cl.
   *H03F 1/02*       (2006.01)
   *H03F 3/21*       (2006.01)
   *H03F 1/56*       (2006.01)

(52) U.S. Cl.
   CPC ............. *H03F 1/0205* (2013.01); *H03F 1/56* (2013.01); *H03F 3/211* (2013.01); *H03F 2200/387* (2013.01); *H03F 2200/451* (2013.01)

(58) Field of Classification Search
   CPC .......... H03F 1/0205; H03F 1/56; H03F 3/211; H03F 2200/387; H03F 2200/451
   (Continued)

(56) References Cited

U.S. PATENT DOCUMENTS 8,957,727 B2    2/2015  Dawson et al.
9,141,832 B2    9/2015  Perreault et al.
(Continued)

OTHER PUBLICATIONS

Borage et al., "Resonant Immittance Converter Topologies", IEEE Transactions on Industrial Electronics, vol. 58, No. 3, Mar. 2011, see Figs. 3 and 4. (Year: 2011).*
(Continued)

*Primary Examiner* — Hafizur Rahman
(74) *Attorney, Agent, or Firm* — Crawford Maunu PLLC

(57) ABSTRACT

Exemplary aspects are directed to a power-amplification circuit including multiple in-parallel circuit paths, each including a power amplifier driving an immittance converter. Current from each output of the respective immittance converters is combined for delivery to a load. In a more specific example, a control circuit may be used to modulate, such as by enabling or disabling power delivered from, one or more of the power amplifiers for fast, coarse resetting of the overall power delivered to the load, and/or to modulate one or more of the modulate immittance converters (e.g., via a phase or signal-timing adjustment) to finely tune the resetting of the overall power delivered to the load. Using the control circuit for providing both the coarse adjustment and the fine adjustment, and fast acting precise delivery of overall power delivered to a load may be realized for any of a variety of applications.

22 Claims, 12 Drawing Sheets

(58) Field of Classification Search
USPC .......................................................... 330/295
See application file for complete search history.

(56) References Cited

U.S. PATENT DOCUMENTS 10,536,093 B2   1/2020   Perreault
2017/0373609 A1* 12/2017 Perreault ............... H02M 1/083

OTHER PUBLICATIONS

A. S. Jurkov, L. Roslaniec, and D. J. Perreault, "Lossless multiway power combining and outphasing for high-frequency resonant inverters," IEEE Transactions on Power Electronics, vol. 29, N.o. 4, pp. 1894-1908, 2013 (Apr. 2014).

R. Frey, "500 w, class e 27.12 MHz amplifier using a single plastic mosfet," 1999 IEEE MTT-S International Microwave Symposium Digest (Cat. No. 99CH36282), vol. 1. IEEE, 1999, pp. 359-362.

J. Choi, Y. Ooue, N. Furukawa et al. "Designing a 40.68 MHz power-combining resonant inverter with egan fets for plasma generation," 2018 IEEE Energy Conversion Congress and Exposition (ECCE). IEEE, 2018, pp. 1322-1327. Abstract only.

D. J. Perreault, "A New Power Combining and Outphasing Modulation System for High-Efficiency Power Amplification," IEEE Transactions on Circuits and Systems, vol. 58, No. 8, Aug. 2011, pp. 1713-1726.

SungWon Chung et al. "Asymmetric Multilevel Outphasing Transmitter using Class-E PAs with Discrete Pulse Width Modulation." IEEE, IMS 2010, pp. 264-267.

* cited by examiner

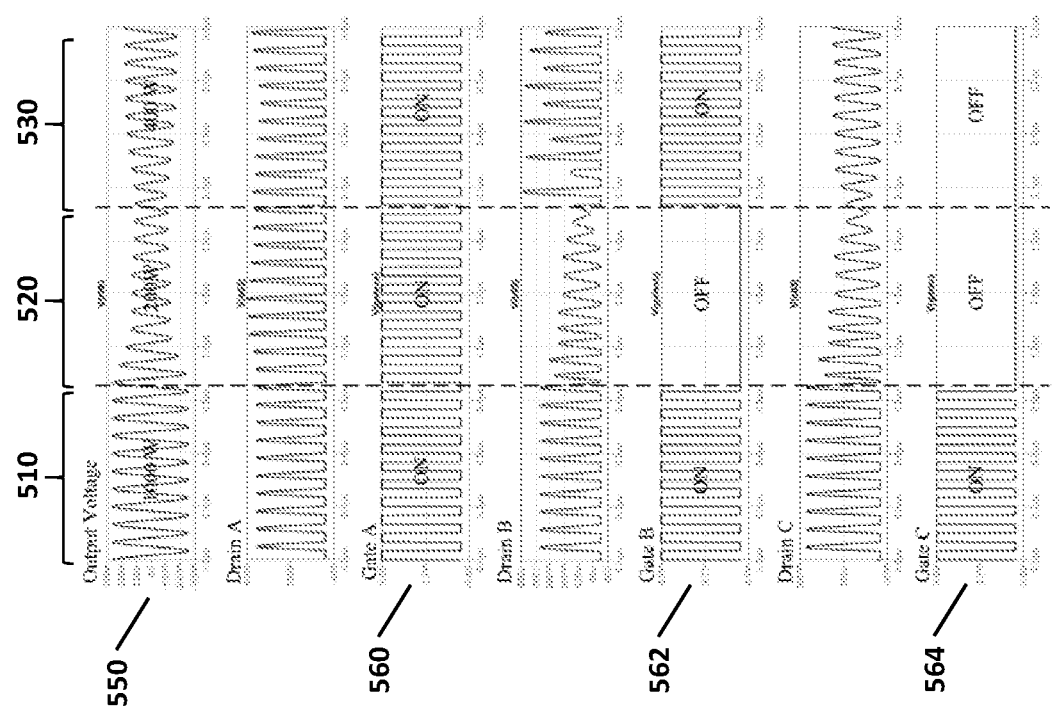

POWER AMPLIFIER WITH EACH OF MULTIPLE IN-PARALLEL CIRCUITS HAVING POWER AMPLIFICATION AND IMMITTANCE CONVERSION

BACKGROUND

Aspects of various embodiments are related generally to the field of power systems, and exemplified by a method to combine and arbitrarily control output power of a plurality of power amplifier circuits.

Applications and benefits of power adjustable amplifiers have been recognized in various devices including radio frequency (RF) generating systems (e.g., plasma generators) for a semiconductor manufacturing process, radio communications systems, broadcasting systems, and magnetic resonance imaging (MRI) systems, etc. For applications such as these, where high power is used, output power from several power amplifier circuits may be combined together. Many techniques for power combination may introduce extra complexity and losses to an overall system. For example, a separate power combiner circuit may be used, which adds size and extra loss to the overall system. Among high power applications, many applications use adjustable output power levels, e.g., from one percent to a hundred percent of full power.

These and other matters have presented challenges to efficiencies of power amplifiers, with adjustable output power, implementations, and for a variety of applications.

SUMMARY

Various example embodiments are directed to issues such as those addressed above and/or others which may become apparent from the following disclosure concerning power adjustability in parallel configured power amplifier circuits.

In certain example embodiments, aspects of the present disclosure involve a plurality of power amplifiers and a plurality of immittance converters used to allow for the efficiently combining of the signals into one, higher power signal.

In a more-specific example system or apparatus, aspects of the present disclosure involve a plurality of power amplifiers configured via in-parallel circuit paths. In this manner a power-amplification circuit includes the multiple in-parallel circuit paths, each including a power amplifier driving an immittance converter. Current from each output of the respective immittance converters is combined for delivery to a load. In a more specific example, a control circuit may be used to modulate, such as by enabling or disabling power delivery from, one or more of the power amplifiers for fast, coarse resetting of the overall power delivered to the load, and/or to modulate such as by adjusting relative timing among the power amplifiers (e.g., via a phase or signal-timing adjustment) to finely tune the resetting of the overall power delivered to the load. Using the control circuit for providing both the coarse adjustment and the fine adjustment, fast acting precise delivery of overall power delivered to a load may be realized for any of a variety of applications.

The above apparatus (or system) may further include a control circuit coupled to at least one of the multiple in-parallel circuit paths to modulate overall power delivery to the load by modulating one or both of: a phase or signal-timing adjustment of the one of the power amplifiers in one of the in-parallel circuit paths for finely tuning overall power delivery to the load; and a coarse setting of one or more of the power amplifiers to affect delivery of power from said one or more of the power amplifiers for coarsely setting the overall power delivery to the load Also consistent with the present disclosure, an apparatus such as described above, a method includes using a plurality of power amplifiers in parallel to drive a plurality of immittance converters also in parallel, wherein each of the plurality of immittance converters has an input driven by an output of at least one of the plurality of power amplifiers; and at an output node, combining current that is derived from output ports of the immittance converters and in response, delivering energy from the power amplifiers to load circuitry.

Such a method may be used with more specific aspects, alone and/or in combination. For example, in connection with the above method, at least one of the plurality of power amplifiers and at least one of immittance converters may receive an input signal respectively for coarse-power-level adjustment and less-than-coarse-power-level adjustment, for the delivering of energy to the load circuitry with the delivered energy switching between multiple power levels as set by the coarse-power-level adjustment and the less-than-coarse-power-level adjustment. As another example aspect, the power amplifiers, the plurality of immittance converters and the load circuitry may be used as part of plasma processing in a semiconductor manufacturing plasma processor, where the switching energy delivered to the load circuitry is RF energy. As yet another example aspect, the power amplifiers, the plurality of immittance converters and the load circuitry may be used as part of a magnetic imaging system or magnetic-resonance imaging system. In yet another example aspect, at least one of the in-parallel circuit paths (including one of the power amplifiers and one of the immittance converters) may receive an input signal providing a power-level adjustment for the delivering of energy to the load circuitry with the delivered energy adjusted to compensate for a mismatched load level of the load circuitry or with the delivered energy adjusted to dampen undesired subharmonic oscillation and to stabilize an RF signal in the delivered energy.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIG. 5A is a timing diagram of a set of signals from various locations in a combined power system while adjusting output power using on/off control, in accordance with the present disclosure.

Figure 1A:
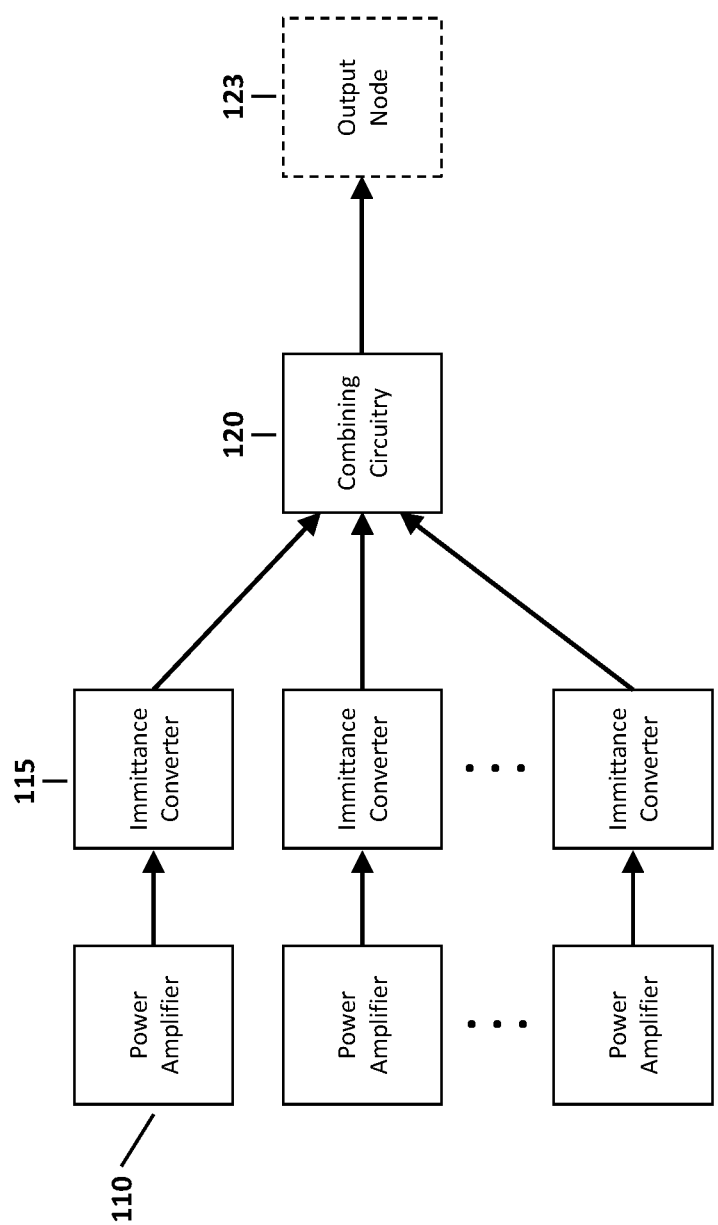
FIG. 1A is a block diagram, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving RF power amplifiers needing the ability to have the adjustable output power. In certain implementations, aspects of the present disclosure have been shown to be beneficial when used in the context of radio frequency (RF) generating systems (e.g., plasma generators) for a semiconductor manufacturing process, radio communications systems, broadcasting systems, and magnetic resonance imaging (MRI) systems, etc. In some embodiments, an example method may be used in plasma generation applications; for example, the disclosed methods and systems may have a faster transient response thereby allowing the method and system to be used under pulse operation, which is typical for plasma generation. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well-known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

According to specific examples of the present disclosure, embodiments are directed to or involve a plurality of power amplifiers. The output of each of the plurality of power amplifiers may be connected to the input of a plurality of immittance converters. The plurality of immittance converters may then be connected in parallel, combining the current from the plurality of power amplifiers into one, higher current, signal. This higher current signal may then be applied to the intended load circuitry.

In another specific example, a system of paralleled amplifiers and immittance converters, as described previously, may have at least one output port in a feedback path. Such a path provides feedback from the output of the system back to at least one of the plurality of power amplifiers. Such a feedback system may be used for various functions. Among the uses of the feedback system may be safety monitoring for the system by assuring that the output power is operating within defined limits. If the output power is outside defined limits, the system may be automatically shut down. Another use for the feedback system is to improve transient times when switching from one power level to another. This may be especially important for plasma processing in semiconductor manufacturing applications where the RF power needs to rapidly switch between multiple power levels. Yet another use for the feedback system is to correct, or adjust, the power amplifiers operation in the case of a mismatched load (which is another common problem in plasma processing). Along with the previously-described uses for the feedback system, it can be useful to dampen undesired subharmonic oscillations to improve the stability of the RF signal. Also the feedback system may be useful in following predefined waveforms to generate arbitrary pulse shapes such as sinc-shaped pulses used in MRI applications.

In yet another example, embodiments are directed to or involve a plurality of power amplifiers. The output of each of the plurality power amplifiers may be connected to the input of a plurality of immittance converters. The plurality of immittance converters are then connected into a plurality of transformers. The load side of the plurality of transformers are connected in parallel combining the current from the plurality of power amplifiers into one, higher current, signal. This higher current signal may then be applied to the intended load circuitry.

According to yet another specific example, the output of each of a plurality of power amplifiers may be connected to the input of a plurality of immittance converters. The plurality of immittance converters is then connected in parallel, combining the current from the plurality of power amplifiers into one, higher current, signal. This higher current signal may then be applied to the intended load. Such an output signal may be level modulated by transitioning a plurality of power amplifiers On and Off. Such a system allows for a coarse adjustment of the systems power level. For example, with four paralleled circuits, there can be four different combinations and therefor four levels: four amplifiers On and no amplifiers Off result in full power output; three amplifiers On and one amplifiers Off result in medium power output; two amplifiers On and two amplifiers Off result in low power output; and one amplifiers On and three amplifiers Off result in very low power output.

Consistent with the above aspects and in other detailed examples, another important aspect of the present disclosure involves at least one of a plurality of power amplifiers using timing adjustments to the On and Off control of the power amplifier. Such a timing adjustment allows for an amplifier output that has a signal phase that is out of phase with at least one of the plurality of amplifiers. Such a difference in signal phase allows for a fine adjustment of output signal power of the combined paralleled power amplifiers and immittance circuits. At least one of a plurality of power amplifiers may be phase-controlled to adjust the output power and allow for any output power to be generated. Adjustment of a power amplifiers input signal phase may be adjusted from 180 degrees (fully out-of-phase with the rest of the circuits) to 360 degrees (fully in-phase with the rest of the circuits).

In one specific example, each of a plurality of power amplifiers is to maintain load-independent zero-voltage switching (ZVS). In order to maintain high efficiency in the power amplifiers, active field-effect transistors (FET) maintain ZVS conditions across the whole operating range. The power control technique utilizing the two mechanisms, modular on/off and phase-shifting, works in conjunction to maintain ZVS condition across all active switches while allowing arbitrary output power to be generated.

In another specific example, the output of each of the plurality power amplifiers may be connected to the input of a plurality of signal processing circuitry. The output of the plurality of signal processing circuits may be connected to the input of a plurality of immittance converters. The plurality of immittance converters is then connected in parallel, combining the current from the plurality of power amplifiers into one, higher current, signal. This higher current signal may then be applied to the intended load. Such signal processing circuitry may consist of, for example, matching networks, balun transformers, filters, etc.

According to yet another example, each of a plurality of signal processing circuits is to provide signal matching between the output of one of the plurality of power amplifiers and the input of an associated one of the plurality of immittance converters.

Turning now to the drawings, FIG. 1A is a system-level diagram illustrating an example of general circuitry connections. The power amplifiers (an example identified as 110) take an external signal and amplify it to generate a power signal. The amplifiers may consist of switched-mode amplifiers, for example class E amplifiers. This output signal from the amplifier is delivered to the connected immittance circuit (an example identified as 115). The output of the plurality of immittance converters may then be combined into one signal, using various methods, as illustrated by block 120. The combined signal can then be connected to the applications load circuitry 123.

Figure 1B:
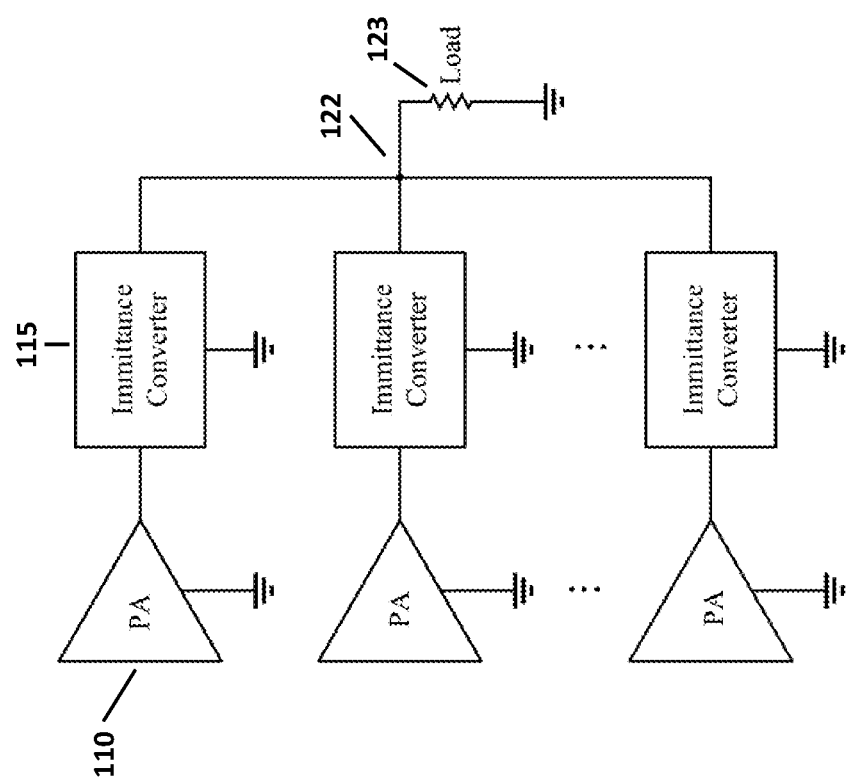
FIG. 1B is another block diagram with direct-connection current combining or summing being depicted, in accordance with the present disclosure.

FIG. 1B is a variation of FIG. 1A where the combining circuit is simply an electrical connection 122 of each of a plurality of power amplifiers (an example identified as 110). The combined signal can then be connected to the applications load circuitry 123.

Figure 1C:
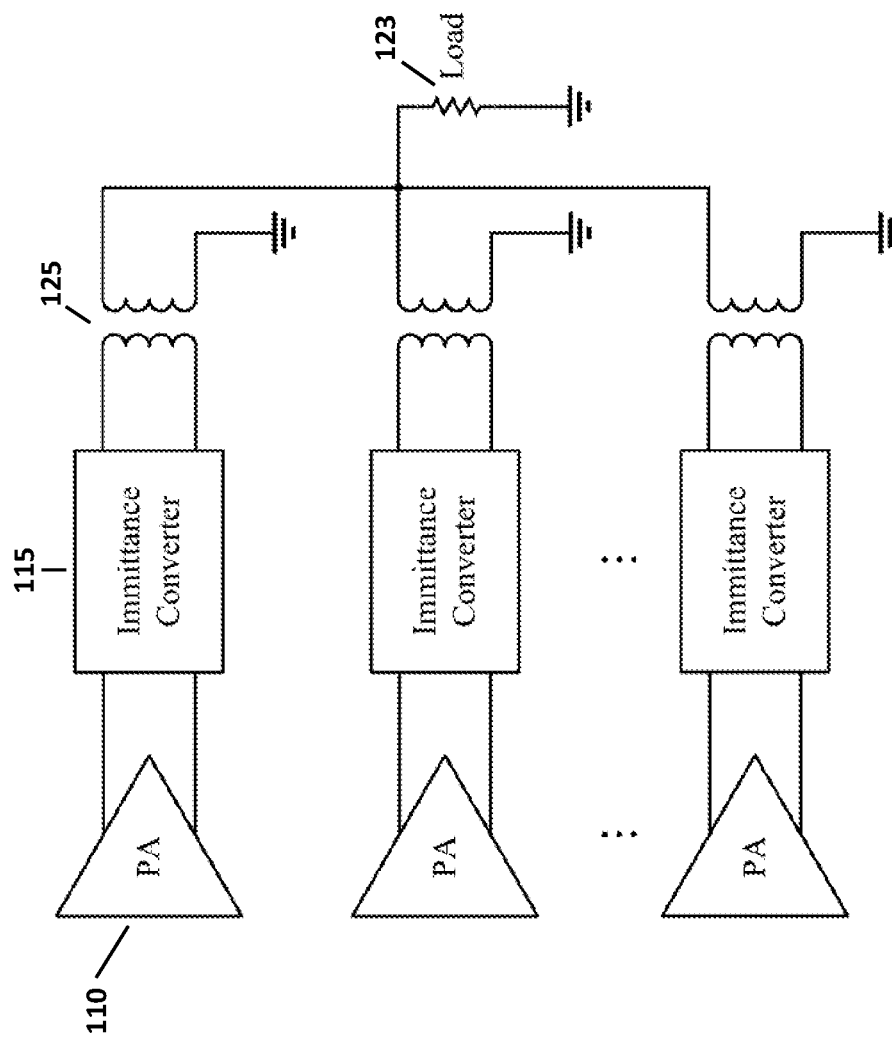
FIG. 1C is another block diagram with transformer-coupled current combining or summing being depicted, in accordance with the present disclosure.

FIG. 1C is a variation of FIG. 1A where the combining circuit is a plurality of transformers (an example identified as 125) allowing for differential output signaling from the plurality of power amplifiers (an example identified as 110) to be combined into a single output signal by connecting the plurality of transformers (an example identified as 125) in parallel, at their outputs. The combined signal can then be connected to the applications load circuitry 123.

Figure 2A:
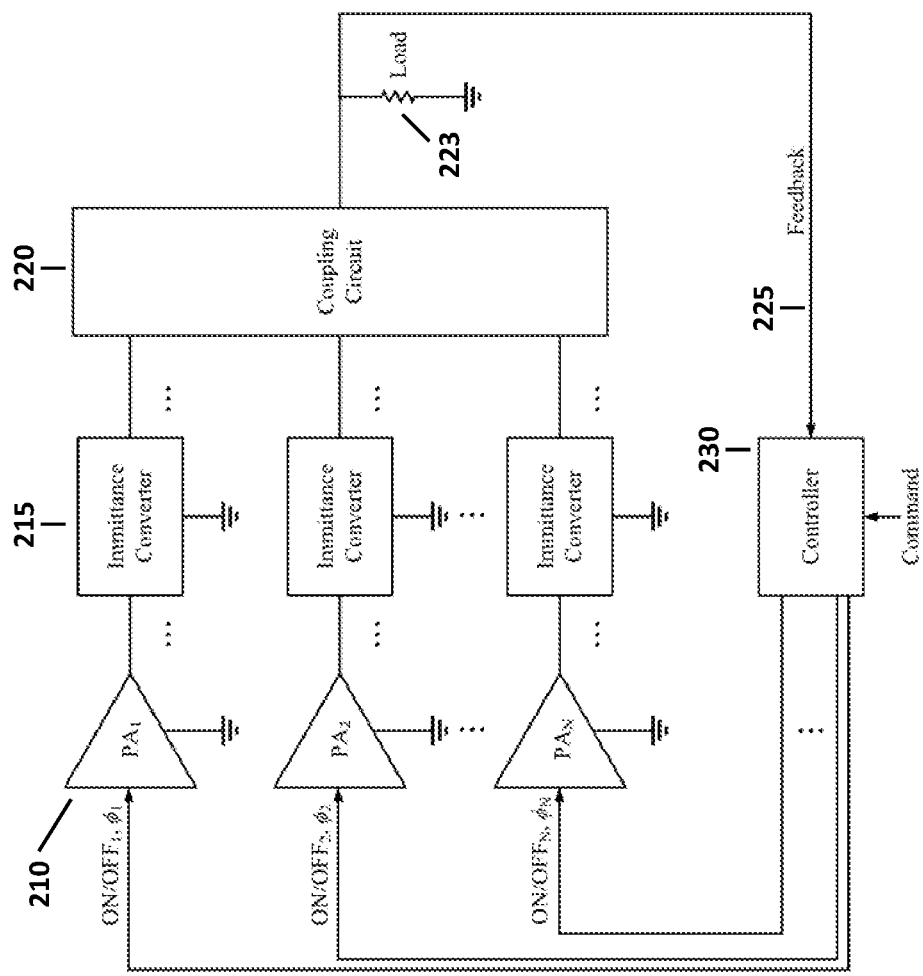
FIG. 2A is another block diagram illustrating an example of a power control system with feedback, in accordance with the present disclosure.

The circuit shown in FIG. 2A illustrates a plurality of power amplifiers (an example identified as 210) which take an external signal and amplify it to generate a power signal. The amplifiers may consist of switched-mode amplifiers, for example class E amplifiers. This output signal from the amplifier is delivered to the connected immittance circuit (an example identified as 215). The output of the plurality of immittance converters may then be combined into one signal, using various methods, as illustrated by block 220. The combined signal can then be connected to the applications load circuitry 223. Also, a feedback connection 225 from the combined signal output is connected to controller 230 (e.g., PLA, microcontroller or other logic circuit). Such a feedback 225/controller 230 system may be used for various functions. Among the uses of the feedback 225/controller 230 system may be safety monitoring for the system by assuring that the output power is operating within defined limits. If the output power is outside defined limits the system may be automatically shut down. Another use for the feedback 225/controller 230 system may be for automatic adjustment of the system power output level. For example, the controller 230 may operate with a predefined power output limit definition. If the output power is low the controller 230, using a signal from the feedback 225 connection may adjust the amplifier system to increase the output power level. If the output power is high the feedback system may adjust the amplifier system to decrease the output power level. The controller 230 may execute the adjustment, bring power up or down, by turning On and Off various power amplifiers (an example identified as 210) to adjust the output power of the system. Such a system allows for a coarse adjustment of the systems power level. For example, with four paralleled circuits, there can be four different combinations and therefor four levels: four amplifiers On and no amplifiers Off result in full power output; three amplifiers On and one amplifiers Off result in medium power output; two amplifiers On and two amplifiers Off result in low power output; and one amplifiers On and three amplifiers Off result in very low power output.

Figure 2B:
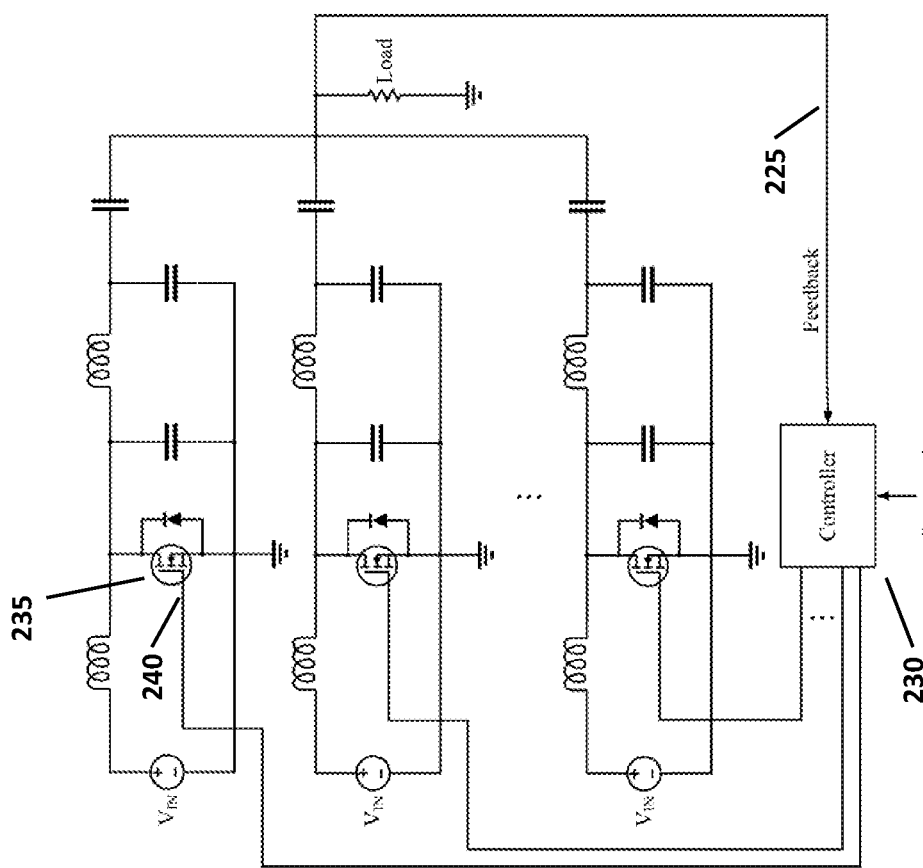
FIG. 2B is a more-detailed diagram illustrating an example of a power control system with feedback, in accordance with the present disclosure.

In FIG. 2B a simplified circuit diagram of the above described power amplifier and immittance converter is shown. Of note is the connection of the feedback 225 to the controller 230. The controller 230 then controls the On state of the power amplifiers by applying the desired modulation signal to the gate (an example identified as 240) of the power amplifiers FET (an example identified as 235). To turn the power amplifier Off an unmodulated signal is applied to the gate (an example identified as 240) of the power amplifiers FET (an example identified as 235).

Figure 3A:
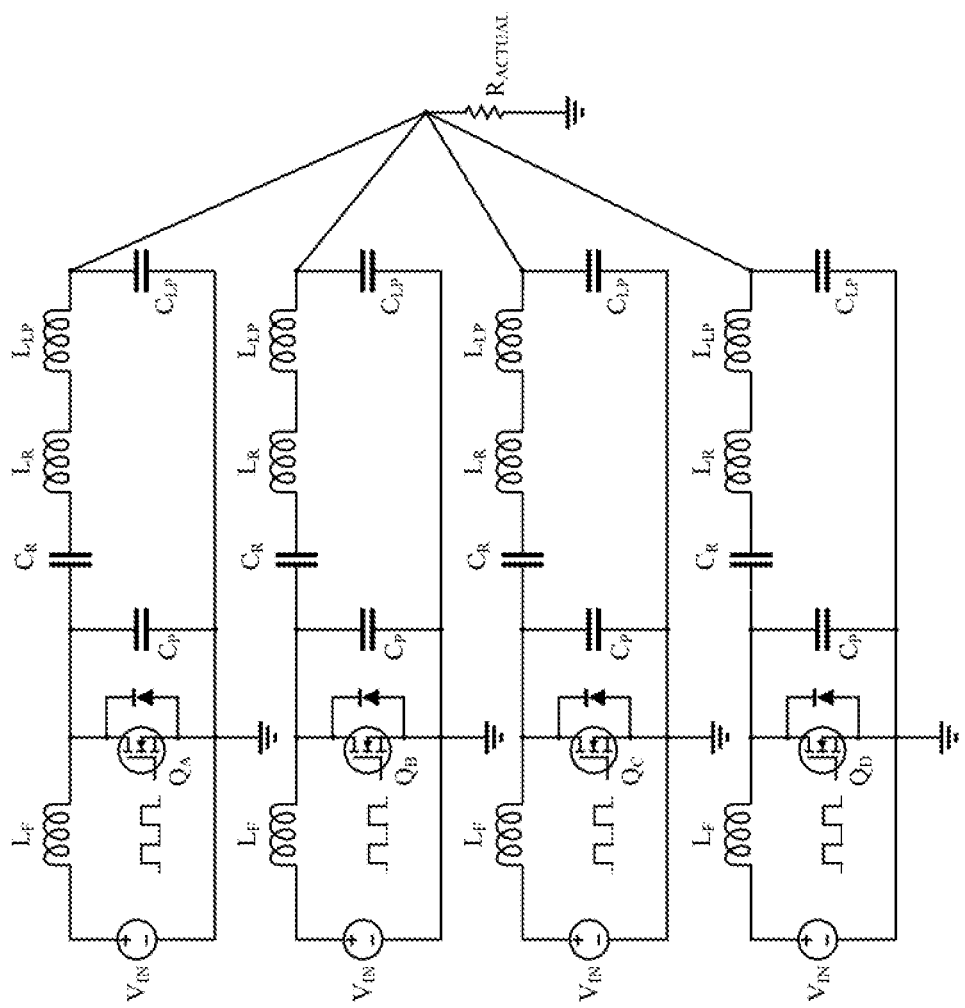
FIG. 3A is a more-detailed diagram illustrating an example of four amplifiers combining power outputs to a load, in accordance with the present disclosure.

The simplified example circuit diagram illustrated in FIG. 3A show a system consisting of four power amplifiers with each power amplifier connected to an immittance converters. The power combining capability comes from the tuning and the control technique. As per previous discussions, the power amplifiers illustrated in FIG. 3A include a power amplifier and an immittance circuit which may be consistent with known switching amplifiers such as class E amplifiers. While certain examples of the present disclosure may discuss or provide explicit design equations for certain (e.g., low-pass) matching networks and class-E power amplifiers, it will be appreciated that other types of matching networks and other classes of amplifiers may be used instead and/or in combination.

Figure 3B:
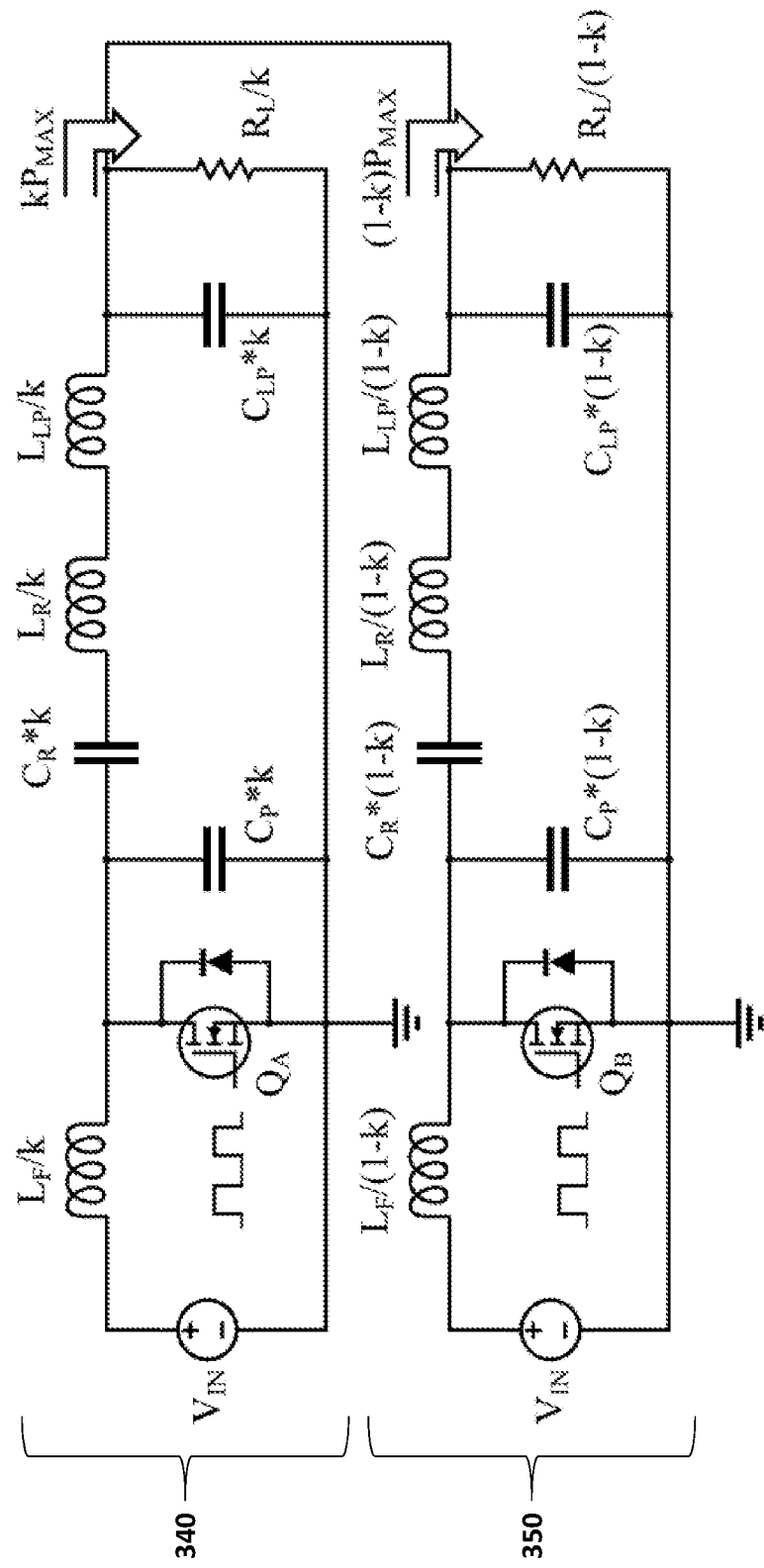
FIG. 3B is a more-detailed diagram illustrating power combing of an arbitrary number of amplifier power outputs, in accordance with the present disclosure.

FIG. 3B illustrates simplified amplifier/immittance circuitry divided into two sections. The form of illustration can be useful in calculation of component values as well as expected output parameters. In this representation, the inductor and capacitor component values, are the combined component values from all the connected amplifiers. In another word, these values are calculated as if one giant amplifier, to generate the full output power Pmax, is being designed. The circuit is then divided into two portions, with the k portion 340 on top and the (1−k) portion 350 on the bottom. This number k can be any value between 0 and 1, and it represents the ratio of the output power from this k portion to the total output power when both portions are "On".

Figure 3C:
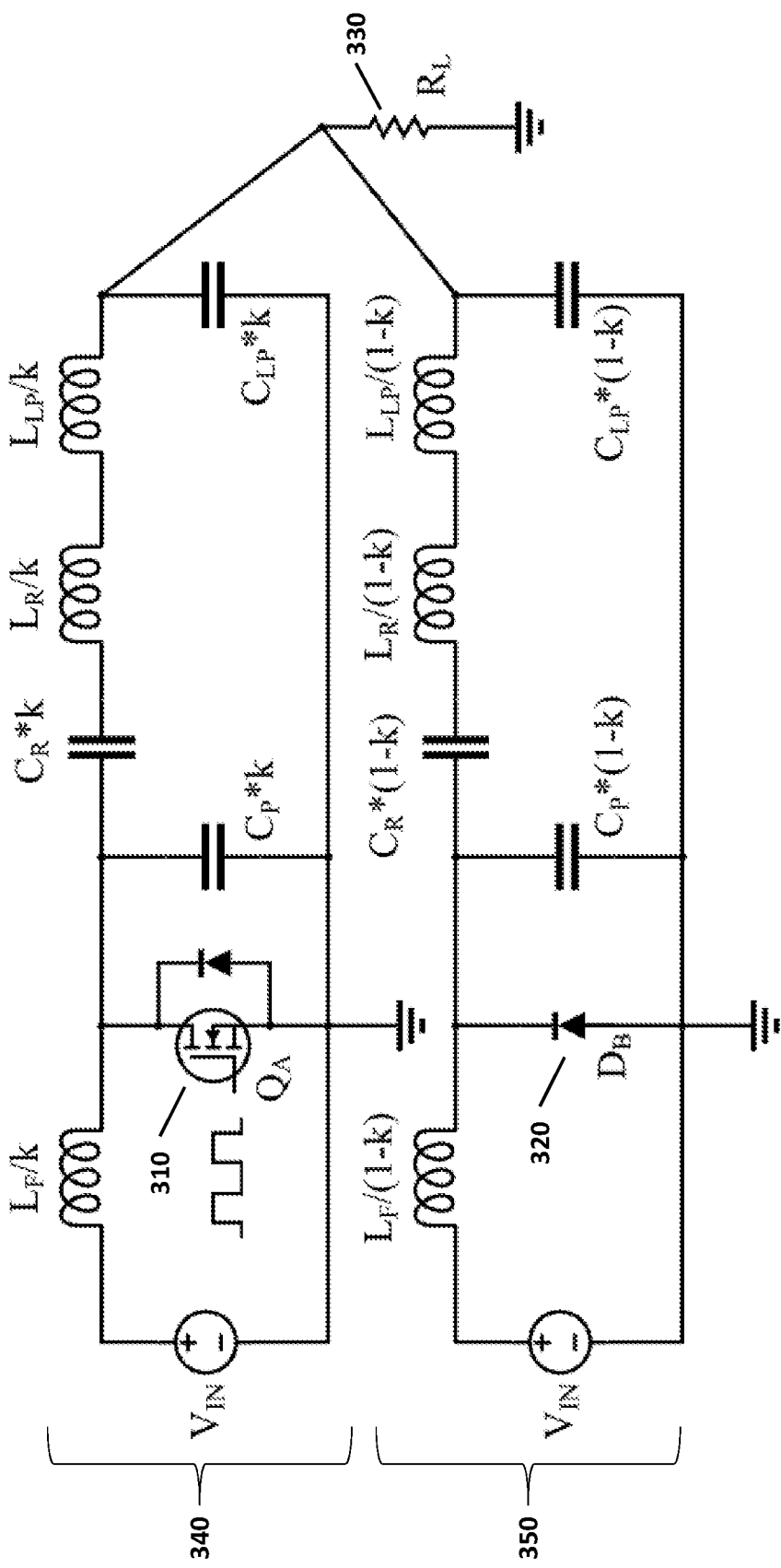
FIG. 3C is a more-detailed diagram illustrating yet another example, also related to the above aspects, of a pair of amplifiers combining power output to a load with one portion of the amplifiers being driven and another not being driven, in accordance with the present disclosure.

FIG. 3C uses the representation presented by FIG. 3B to simplify analysis of a paralleled power amplifier system with a proportion of (1−k) amplifiers 350 turned Off while a proportion of (k) amplifiers 340 are turned on and applying power to $R_L$ 330. FET QA 310 has a modulating signal applied and if there is On. In the lower circuit (k−1 section) 350 the FET is not turned On and therefor only acts as a diode ($D_B$ 320).

Figure 4A:
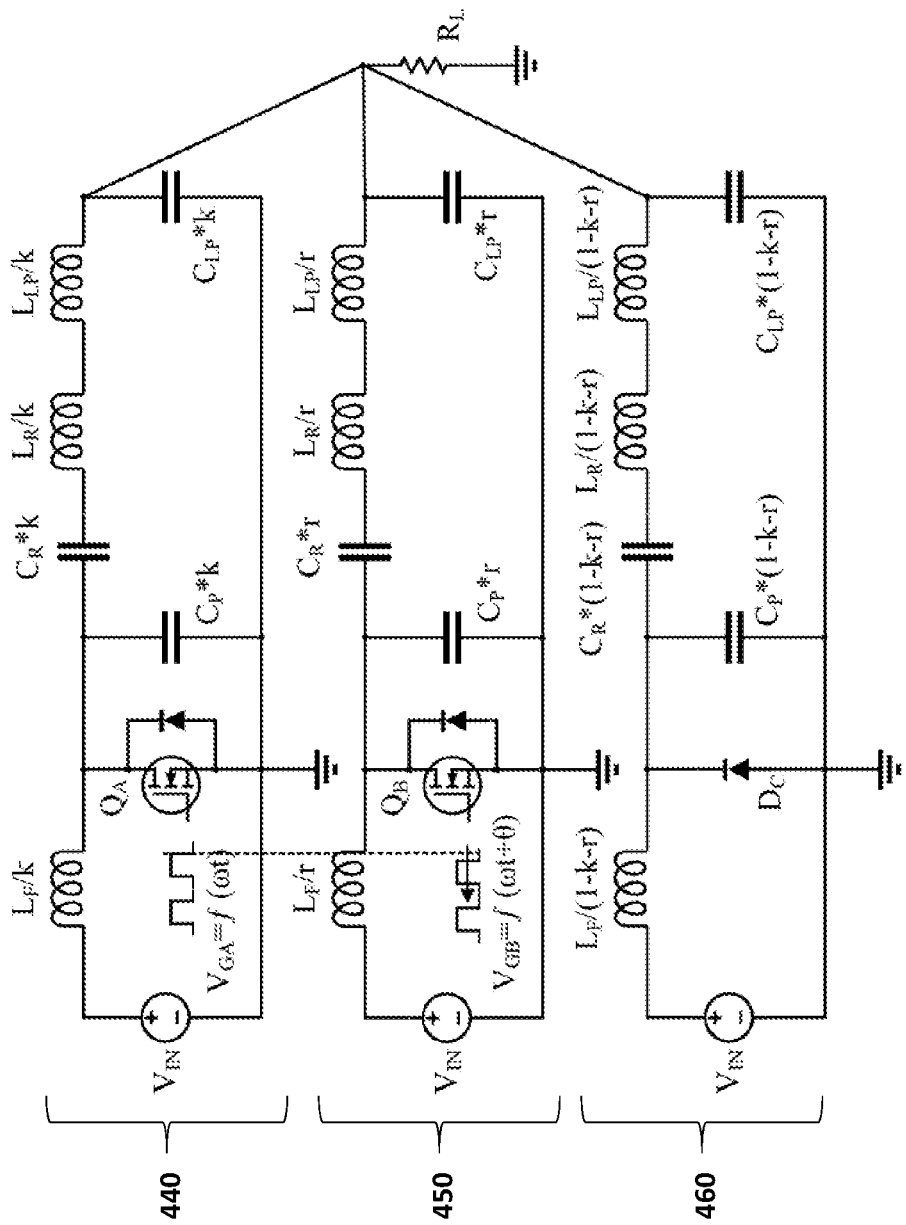
FIG. 4A is a circuit diagram illustrating an example of an arbitrary number of amplifiers combining output to a load with one portion being driven by a signal, another portion not being driven, and yet another portion being driven with a phase-adjusted signal, in accordance with the present disclosure.

FIG. 4A illustrates simplified amplifier/immittance circuitry divided into three sections. The circuit diagram representing a power-combined power amplifier system for arbitrary output power. The portion "k" 440 on top is driven by a fixed gate signal. The portion "r" 450 in the middle is driven by a phase-shifted gate signal. The portion "1−k−r" 460 on the bottom is not driven. Such phase-shifted gate signal adjustment allows for an amplifier output that has a signal phase that is out of phase with at least one of the plurality of amplifiers. Such a difference in signal phase allows for a fine adjustment of output signal power of the combined paralleled power amplifiers and immittance circuits. Adjustment of a power amplifiers input signal phase may be adjusted from 180 degrees (fully out-of-phase with the rest of the circuits) to 360 degrees (fully in-phase with the rest of the circuits).

Figure 5B:
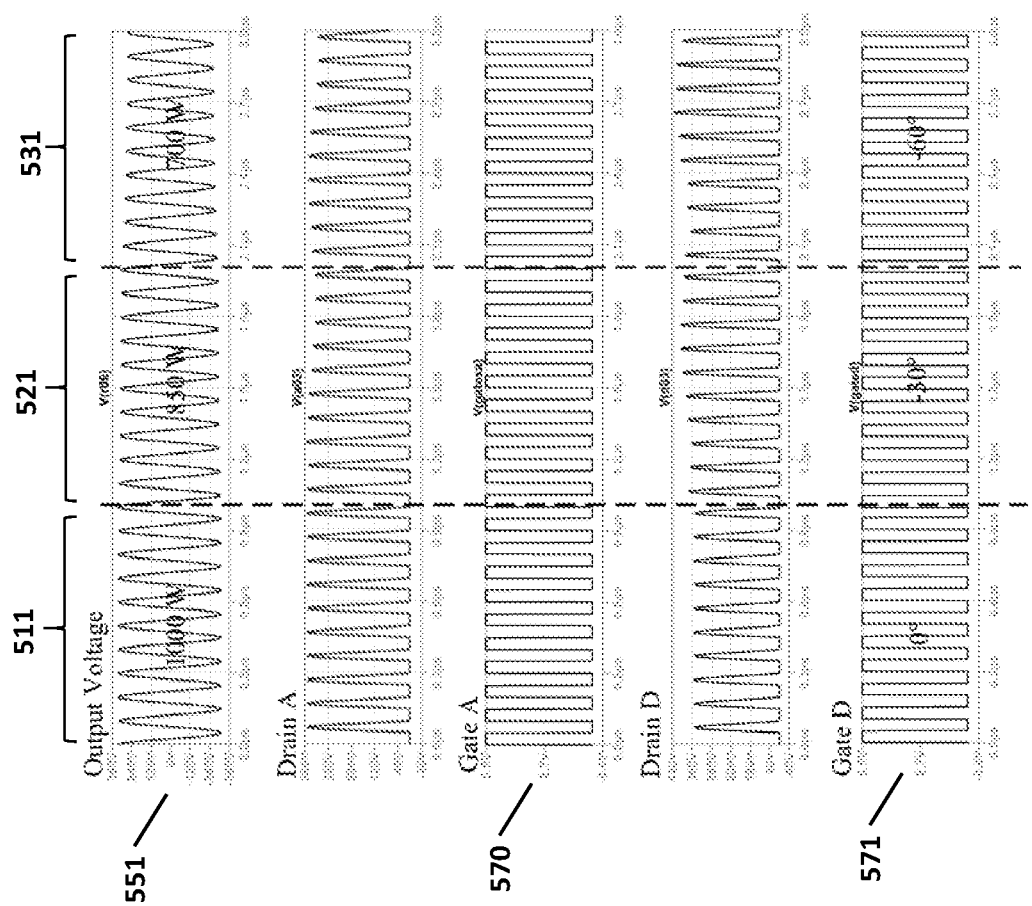
FIG. 5B is a timing diagram of a set of signals from various locations in a combined power system while adjusting output power using phase-shift control, in accordance with the present disclosure.

FIG. 5A is a timing diagram from a system consisting of three power amplification stages, and showing the output voltage (corresponding to output power) with the voltage waveforms across the switches, as well as the gate waveforms controlling these switches. This figure shows that by turning ON/OFF a different number of units (e.g., by changing the gate signal from ON (square wave with 50% duty cycle) to OFF (or 0 Volts)), the output power can be quickly increased/decreased. More specifically, the timeline in FIG. 5A is divided into three regions noted as 510, 520, and 530. In the first time region 510, the power amplification circuits are controlled by a modulating signal 560, 562, 564 (therefore in an "On" state). In this configuration the output voltage 550 is "large". In the second time region 520, the first amplifier circuit is controlled by a modulating signal 560 (therefore in an "On" state). The second and third amplifier circuits are turned "Off" as at 562 and 564. In this configuration the output voltage 550 is "small". In the third time region 520, the first and second amplifier circuits are controlled by a modulating signal 560, 562 (therefore in an "On" state). The third amplifier circuits turned "Off" 564. In this configuration the output voltage 550 is "medium". This is an illustration of output amplitude control turning amplifiers On and/or Off Also consistent with the previously-discussed embodiments, FIG. 5B is a timing diagram from a system consisting of two power amplifiers stages to illustrate amplitude control by phase, or time, shifting of the modulating signal. The time is divided into three regions noted as 511, 521, and 531 and useful for showing how fine control of the power delivery to the load may be effected. The first amplifier is controlled by a modulating signal 570 in all three time regions. The second amplifier is controlled by a phase (or time) shifted signal 571 relative to the first amplifiers modulating signal 570. In time region 511 the second amplifier is not shifted, or 0 degrees. In this case the output voltage 551 is relatively large in comparison. In time region 521 the second amplifier is shifted by −30 degrees. In this case the output voltage 551 is relatively medium in comparison. In time region 531 the second amplifier is shifted by −60 degrees. In this case the output voltage 551 is relatively small in comparison.

FIG. 5B shows that the output power can be finely adjusted by a phase shift of the gate signal on one of the units. Combining with the modular ON/OFF control, arbitrary output power from zero to $P_{MAX}$ can be achieved.

In one specific example, embodiments are directed to a power-amplification circuit including a control circuit to control at least one of a plurality of power amplifiers. The control circuit may coarsely set a power-amplification level delivered to the load circuitry. Coarse adjustment may be accomplished by turning On or Off at least one of the plurality of power amplifiers. The control circuit may finely set a power-amplification level, associated with one of the plurality of immittance converters, to the load circuitry. Fine adjustment may be accomplished by adjusting the phase or timing delay of the power amplifiers input signal at least one of the plurality of power amplifiers.

In another specific example, a power-amplification circuit may include three or more in-parallel feed-forward paths. Such paths may each include one of the plurality of power amplifiers and one of the plurality of immittance converters. Power delivery to the load circuitry may be set via at least one of the in-parallel feed-forward paths being disabled and signal phase or timing in another of the in-parallel feed-forward paths being controlled or delayed.

In certain more-specific examples, a power-amplification circuit may include a control circuit to set the power delivery to the load circuitry by disabling said at least one of the in-parallel feed-forward paths. Further, the control circuit may set the power delivery by controlling the signal phase or timing in the other of the in-parallel feed-forward paths.

According to another specific example of the present disclosure, a power-amplification circuit may include a feedback path which may provide a signal path from the load circuitry to the control circuit.

In yet another specific example of the present disclosure, a power-amplification circuit where each of a plurality of immittance converters may include at least one capacitor and at least one inductor. Also, the said one capacitor and said one inductor may have a value set (calculated) as a function of the intended load circuitry.

In one specific example, embodiments are directed to methods involving using a plurality of power amplifiers. The output of each of the plurality power amplifiers may be connected to the input of a plurality of immittance converters. The plurality of immittance converters may then be connected in parallel, combining the current from the plurality of power amplifiers into one, higher current, signal. This higher current signal may then be applied to the intended load circuitry.

In another specific example, a method of paralleled amplifiers and immittance converters, as described previously, may have at least one output port in a feedback path. Such a path provides feedback from the output of the system back to at least one of the plurality of power amplifiers. Such a feedback system may be used for various functions. Among the uses of the feedback system may be safety monitoring for the system by assuring that the output power is operating within defined limits. If the output power is outside defined limits the system may be automatically shut down. Another use for the feedback system is for automatic adjustment of the system power output level. For example, the feedback system may operate with a predefined power output limit definition. If the output power is low the feedback system may adjust the amplifier system to increase the output power level. If the output power is high the feedback system may adjust the amplifier system to decrease the output power level.

In yet another example, embodiments are directed to a method involving a plurality of power amplifiers. The output of each of the plurality power amplifiers may be connected to the input of a plurality of immittance converters. The plurality of immittance converters is then connected in to a plurality of transformers. The load side of the plurality of transformers are connected in parallel combining the current from the plurality of power amplifiers into one, higher current, signal. This higher current signal may then be applied to the intended load circuitry.

According to yet another specific example, a method in which the output of each of a plurality of power amplifiers may be connected to the input of a plurality of immittance converters. The plurality of immittance converters is then connected in parallel, combining the current from the plurality of power amplifiers into one, higher current, signal. This higher current signal may then be applied to the intended load. Such an output signal may be level modulated by transitioning a plurality of power amplifiers On and Off. Such a system allows for a coarse adjustment of the systems power level. For example, with four paralleled circuits, there can be four different combinations and therefor four levels: four amplifiers On and no amplifiers Off results in full power output; three amplifiers On and one amplifiers Off results in medium power output; two amplifiers On and two amplifiers Off results in low power output; one amplifiers On and three amplifiers Off results in very low power output.

In one specific example, a method involves each of a plurality of power amplifiers is to maintain load-independent zero-voltage switching.

Consistent with the above aspects and in other detailed examples, another aspect of the present disclosure involves a method in which at least one of a plurality of power amplifiers using timing adjustments to the On and Off control of the power amplifier. Such a timing adjustment allows for an amplifier output that has a signal phase that is out of phase with at least one of the plurality of amplifiers. Such a difference in signal phase allows for a fine adjustment of output signal power of the combined paralleled power amplifiers and immittance circuits. At least one of a plurality of power amplifiers may be phase-controlled to adjust the output power and allow for any output power to be generated. Adjustment of a power amplifiers input signal phase may be adjusted from 180 degrees (fully out-of-phase with the rest of the circuits) to 360 degrees (fully in-phase with the rest of the circuits).

Another specific example involves a method where the output of each of the plurality power amplifiers may be connected to the input of a plurality of signal processing circuitry. The output of the plurality of signal processing circuits may be connected to the input of a plurality of immittance converters. The plurality of immittance converters is then connected in parallel, combining the current from the plurality of power amplifiers into one, higher current, signal. This higher current signal may then be applied to the intended load. Such signal processing circuitry may consist of, for example, matching networks, balun transformers, filters, etc.

According to yet another example involves a method including a plurality of signal processing circuits each of which is to provide signal matching between the output of one of the plurality of power amplifiers and the input of an associated one of the plurality of immittance converters.

In one specific example, embodiments are directed to a method involving a power-amplification circuit including a control circuit to control at least one of a plurality of power amplifiers. The control circuit may coarsely set a power-amplification level delivered to the load circuitry. Coarse adjustment may be accomplished by turning On or Off at least one of the plurality of power amplifiers. The control circuit may finely set a power-amplification level, associated with one of the plurality of immittance converters, to the load circuitry. Coarse adjustment may be accomplished by adjusting the phase or timing delay of the power amplifiers input signal at least one of the plurality of power amplifiers.

In another specific example, a method comprising a power-amplification circuit may include three or more in-parallel feed-forward paths. Such paths may each include one of the plurality of power amplifiers and one of the plurality of immittance converters. Power delivery to the load circuitry may be set via at least one of the in-parallel feed-forward paths being disabled and signal phase or timing in another of the in-parallel feed-forward paths being controlled or delayed.

In certain more-specific examples, a method comprising a power-amplification circuit may include a control circuit to set the power delivery to the load circuitry by disabling said at least one of the in-parallel feed-forward paths. Further, the control circuit may set the power delivery by controlling the signal phase or timing in the other of the in-parallel feed-forward paths.

According to another specific example of the present disclosure involves a method where in a power-amplification circuit may include a feedback path which may provide a signal path from the load circuitry to the control circuit.

In certain of the specific examples discussed in connection with the present disclosure, the disclosed circuitry is used to provide a tuning method that facilitates delivery of output power from multiple amplifiers to be directly connected (or indirectly coupled) without the need for any additional power combiner networks. This is in contrast with some conventional high-power radio frequency amplifier systems (e.g., where separate power combiner circuits are used to combine the output powers), and the approach and circuitry of such specific examples of the present disclosure may use components as already existing in the high power amplifiers without adding any extra components. Some of the many benefits which may be realized, depending on the specific implementations, include simplicity of the design and the reduction in the number of components needed to achieve a corresponding level of power combining capability, readily designable and scaleable circuitry, various forms of circuitry that is small in size, and optimization in terms of efficiency.

The above-described methodology and/or circuitry may be used in combination with a variety of loads, equipment and/or applications and customized accordingly. As examples, noted are plasma processing and MRI. Further, such methodology and/or circuitry may be incorporated with and/or used in connection with: wireless power transfer (WPT) systems such as those used to wirelessly charge electric vehicles and radio-frequency (dielectric) heating including, for example, those used kill pests in agriculture and to kill cancer or tumor issue in medicine; induction heating for furnace, welding, cooking, brazing, sealing, plastic processing, pyrolysis, etc.; transmitting power amplifiers used in base stations for radio, cellphone, TV broadcasting; and other applications needing or benefiting from provision of a very short burst of very high power level(s). Examples of how such methodology and/or circuitry may be customized for such loads, equipment and/or applications include: using the controller to cause the output power level to deliver short bursts of very high power levels as well as intermediate and/or relatively low power levels (e.g., with sharp transitions and/or ramping the power up or down as may be needed for a certain load feature or mode of use); and using the controller to manipulate the output power level to deliver varying power levels to the load device which may have a changing loading parameter such as may be useful for testing where the feedback path of FIG. 2A may be used to report back to the controller.

MORE SPECIFIC/EXPERIMENTAL EXAMPLES AND ASPECTS

Experimental/test examples of such a power-combinable power amplifier (using class-E amplifier solely for discussion purposes) have been developed to allow multiple amplifiers to combine their output power directly even when faced with timing mismatch between amplifiers. As shown by testing, such circuit-based methods operate under continuous operation and show a stable operation both thermally and electrically. In one such example experiment, a 1500 W RF amplifier manifests 89% efficiency and 25 W/in3 power density at 40.68 MHz utilizing six class-E power amplifiers combining power (as illustrated and described in the examples above). This achieved efficiency is much higher than other studies at similar frequency and power level such as realizing 79%—100 W—27.12 MHz as in one effort, 83%—490 W—27.12 MHz in another effort, 83%—1150 W—40.68 MHz. See, e.g., A. S. Jurkov, L. Roslaniec, and D. J. Perreault, "Lossless multiway power combining and outphasing for high-frequency resonant inverters, "IEEE Transactions on Power Electronics, vol. 29, no. 4, pp. 1894-1908, 2013; R. Frey, "500 w, class e 27.12 MHz amplifier using a single plastic mosfet," 1999 IEEE MTT-S International Microwave Symposium Digest (Cat. No. 99CH36282), vol. 1. IEEE, 1999, pp. 359-362; and J. Choi, Y. Ooue, N. Furukawa, and J. Rivas, "Designing a 40.68 MHz power-combining resonant inverter with egan fets for plasma generation," 2018 IEEE Energy Conversion Congress and Exposition (ECCE). IEEE, 2018, pp. 1322-1327. Moreover, the achieved power density is also more than three times higher than the most power-dense RF generator commercially available, APEX RF Generator (7.4 W/in3—5500 W—13.56 MHz (see Advanced Energy. Apex RF generators and power-delivery systems, at www.advancedenergy.com/globalassets/resources-root/data-sheets/apex-rf-generators-data-sheet.pdf).

In specific examples applicable to low-pass matching network and class-E power amplifier combinations, it may be assumed that for most high-power applications, the output impedance the amplifiers would be lower than the actual load impedance. As a result, low-to high matching networks would be used as part of each amplifier circuit. Furthermore, in order to optimize output power and also to have fast transient times, multiple (e.g., four) power-combinable class-E power amplifiers may be used to directly combine the output power as shown by example in FIG. 3A. The power combining capability actually comes from the tuning and the control technique. The tuning of power-combinable class-E amplifiers starts by selecting the component values, $L_f$, $C_p$, $L_r$, and $C_r$, as well as the output impedance each amplifier sees, $R_o$, following standard class-E design equations according to the desired operation regime and power level. For example, if one wishes to achieve the maximum output power, the following component values should be used:

$$R_o = \frac{k_p V_{in}^2}{P_{out}}, C_p = \frac{k_c}{\omega R_o}, L_f = \frac{k_l R_o}{\omega} \qquad (1)$$
$$L_r = \frac{QR_o}{\omega}, C_r = \frac{1}{\omega Q R_o},$$

where $k_p$=1.365, $k_c$=0.685, $k_l$=0.732, and Q is the desired loaded quality factor of the series output filter. Depending on the specified actual load impedance, $R_{actual}$, and the number of circuits to be combined, N, the load impedance each circuit has to be matched to, $R_1$, can be calculated from:

$$R_l = N \times R_{actual}$$

In order to minimize the effect an amplifier can have on the others, each low-pass matching network is modified to present a very high impedance when looking back into each amplifier while still largely maintaining the impedance matching functionality. It is shown that this condition is met when $L_{lp}$ and $C_{lp}$ values tuned as follows:

$$C_{lp} = \frac{1}{\omega \sqrt{R_l R_o}}, L_{lp} = \frac{\sqrt{R_l R_o}}{\omega}$$

Furthermore, with these modified matching network values, if this example is to then change the load resistance an amplifier sees from $R_1$ to $R_{l,new}$, the output power from that unit would then change by:

$$P_{out,new} = P_{out,orig} \frac{R_{l,new}}{R_{l,orig}}$$

However, this choice of $C_{lp}$ and $L_{lp}$ makes the impedance looking into the modified low-pass network slightly inductive. To compensate, an extra capacitance is added to the $C_p$ resulting in:

$$C_{p,tot} = \frac{k_c}{\omega R_o}\left(1 + \sqrt{\frac{R_o}{R_l}}\right)$$

While such specific examples may provide explicit design equations for low-pass matching network and class-E power amplifier combination, as noted above the methodology here can be directly applied to other types of matching networks and other classes of amplifiers.

Figure 4B:
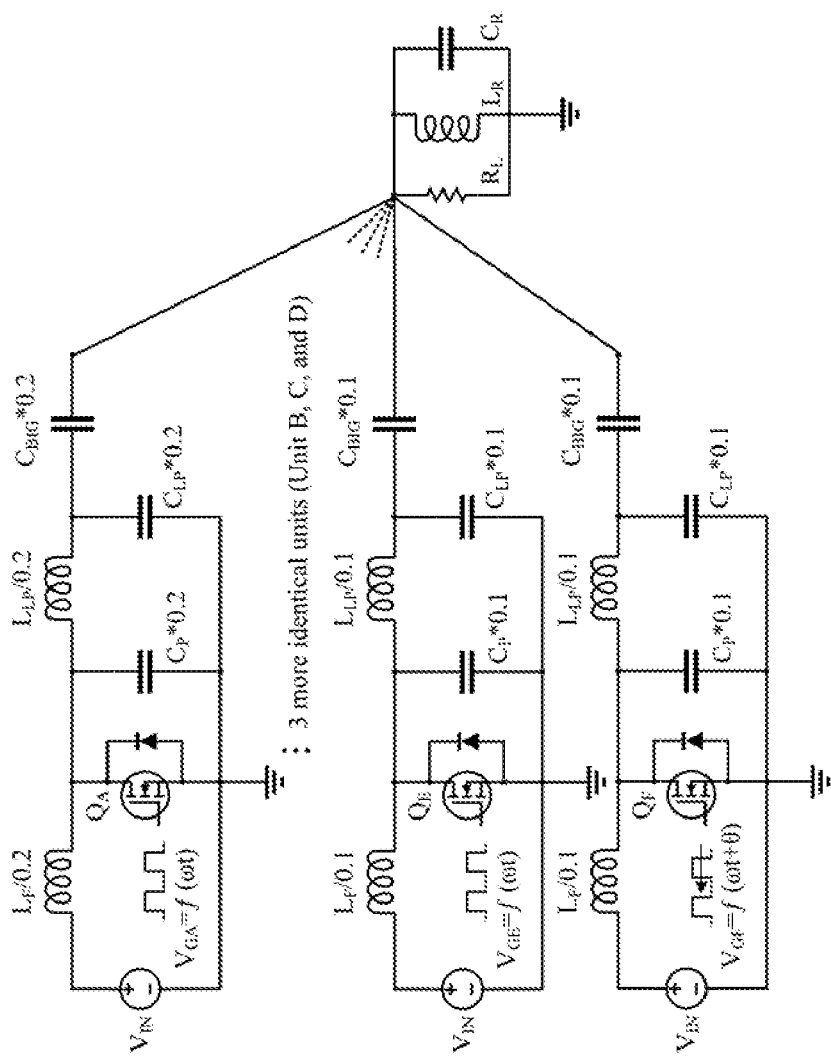
FIG. 4B is a circuit diagram illustrating an example of six amplifiers combining power output to a load with several amplifiers being driven by a signal and one amplifier being driven with a phase adjusted signal, in accordance with the present disclosure.

In connection with various prototypes and experimental results, FIG. 4B shows the schematic of a circuit used in one such prototype. This circuit consisted of six power amplifier circuits A thru F. In this schematic, the unit A to D are the 300 W units, and unit E and F are the 150 W units. Here a single parallel resonant filter is used at the output instead of six separate series resonant filter along the pre-combined branches. This reduces the overall component count and final size/volume of the circuit. To still maintain dc isolation, dc-blocking capacitors, $C_{BIG}(s)$, are also added to the circuit.

A validation/detailed-experimental circuit is implemented on a standard 4-layer FR4 PCB using the component values from a simulation. Five of the sub-circuits (unit A to E) share the same gating signal from one channel of a two-channel signal generator. AND logic gates are used to buffer these signals into each unit, as well as allowing separate control of enable/disable for each unit to perform the modular on/off control. The phase-shift unit (Unit F) receives its gating signal from the second channel of the signal generator which is set to be synchronized with the first one but with phase-shifting capability. In this example, all of the inductors are air-cored and hand-wound. 12 AWG magnet wires are used for the $L_f(s)$ and $L_{lp}(s)$ of unit A to D, as well as for the $L_r(s)$. 16 AWG magnet wires are used for the $L_f(s)$ and $L_{lp}(s)$ of unit E and F. This smaller diameter wire allows for roughly the same volume of the inductors in the lower power units as those in the higher power units. Low loss COG ceramic capacitor from American Technical Ceramic (ATC) are used for Cp(s) Clp(s) and Cr(s). Due to the high operating frequency, parasitic inductance and capacitance of the PCB traces also affect the tuning and are taken into account. GS66504B(s), 100 mΩ 650 V GaN transistors, are used as the main switches in unit A to D. Another GaN device in the same series but with half the die size, GS66502B(s), 200 mΩ 650 V GaN transistors, are used in unit E and F. To sufficiently drive the gate of the tested GaN HEMTs, low-side gate drivers, LM5114 from Texas Instruments, are used. The gate drivers are placed as close as possible to the GaN switches to minimize the loop inductance in the gate, as well as use a gate resistor of 2.4 Ω 2 to dampen any ringing in the gate voltage. Additionally, SiC Schottky diodes STPSC406 from ST Microelectronics are used/added in parallel to the switches to reduce the loss associated with reverse conduction in GaN transistor. To facilitate the cooling of the switching devices, custom copper heat spreader may be made with six small posts that make direct contact to the thermal pad of the GaN transistors via 3.5 mm drill holes directly under the devices. Water cooling, which is standard for commercial RF systems at this power level, may also be used. The input power may be calculated from the dc input voltage and current under continuous operation. The input voltage is measureable with a digital multimeter (e.g., Agilent 34411A), and the input current is recorded from the readout of the dc power supplies (e.g., Agilent N5767A(s)). The output power into the 50Ω load may be measured with a directional coupler/power meter setup. The setup consists of a calibrated 4-port RF directional coupler, C5827-10, from Werlatone Inc., two N8482A thermocouple power sensors from Keysight Technologies, and an N1914A EPM series power meter from Keysight Technologies.

In a first test the output power is adjusted to 1500 w with units A, B, C, D, and E set to "On". Since the full power of the circuit is slightly (too) high, to get to 1500 W more precisely, the unit F may be adjusted to 20 degree phase-shift.

In a second test the unit E is turned "Off," and at this power level it operates as a rectifier. To get 800 W more precisely, the unit F is adjusted to 55 degree phase-shift while the rest of the units are "On" [0.8k, 0.1r, 55θ].

In a third test, only the unit A (the 20% unit) and E (the 10% unit) are "on." To get 100 W more precisely, the unit F is adjusted to 43 degree phase-shift and the rest of the units are "off" [0.3k, 0.1r, 43θ].

The pulsing frequency in the above tests may be at a level of 100 kHz. From the experimental waveforms, very fast transient time of less than 0.5 μs (approximately 7 cycles) is observed at each power transition. The measurement results prove to be very congruent with the simulations. Efficiencies observed in the three tests are: 93% efficiency at the full rated power of 1500 W, above 90% efficiency down to half the rated power of 750 W, and above 80% efficiency all the way down to 100 W power.

As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 115 of FIG. 1A and 230 of FIG. 2A depict a block/module as described herein). Such circuits or circuitry are used together with other elements to exemplify how certain embodiments may be carried out in the form or structures, steps, functions, operations, activities, etc. As examples, wherein such circuits or circuitry may correspond to logic circuitry (which may refer to or include a code-programmed/configured CPU); and may for example be a microcontroller or programmable logic array programmed/configured to carry out a process or method (sometimes "algorithm") by performing steps corresponding to the above-described steps of the methodology and/or relating to the circuit-based associated functionality as discussed therewith. In certain embodiments such as these using programmable circuitry, the circuitry includes memory circuitry (among other logic, clock, register-based and control/data specific circuitry) for storing and accessing program code to be read and executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). The controller (e.g., 230 of FIG. 2A) is one such example of a depicted block that may be implemented as such a programmable circuit.

In accordance therewith, another aspect of the present disclosure is directed to a non-transitory memory device (e.g., a plug magnetically with code) which may be accessed by circuitry including such a CPU-based controller (e.g., 230 of FIG. 2A) to execute a program for performing a method such as one of the methods disclosed above. For example, one such method includes: in-parallel power amplifiers respectively driving in-parallel immittance converters (as depicted), and at an output node combining current that is derived from output ports of the immittance converters to deliver energy from the power amplifiers to load circuitry. The CPU-based controller may also perform other steps such as: turning On and Off a power amplifier, effecting delay in the processing path of an immittance converter, responding to feedback at the output node for monitoring-related tasks and testing. In other examples, Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. A power-amplification circuit comprising:
a plurality of immittance converters arranged in parallel;
a plurality of power amplifiers arranged in parallel to drive the plurality of immittance converters also in parallel, wherein each of the plurality of immittance converters has an output and has an input driven by an output of at least one of the plurality of power amplifiers;
current-combining circuitry to combine current, provided in response to each of respective output ports of the plurality of immittance converters, at an output node; and
load circuitry coupled to the current-combining circuitry via the output node.

2. The power-amplification circuit of claim 1, further including a control circuit having an input port coupled to the load circuitry and having at least one output port in a feedback path to control at least one of the plurality of power amplifiers arranged in parallel.

3. The power-amplification circuit of claim 1, wherein current-combining circuitry to combine current includes a plurality of transformers to couple the current for combination on a load side of the plurality of transformers, and wherein the output node is between the load side of the plurality of transformers and the load circuitry.

4. The power-amplification circuit of claim 1, wherein delivery of energy from the plurality of power amplifiers is modulated by transitioning each of the plurality of power amplifiers On and Off.

5. The power-amplification circuit of claim 1, wherein each of the plurality of power amplifiers is to maintain load-independent zero-voltage switching.

6. The power-amplification circuit of claim 1, wherein each of the plurality of power amplifiers is modulated by transitioning each of the plurality of power amplifiers On and Off using timing that effects coordinated control of phase angle in a signal used to drive an associated one of the plurality of power amplifiers.

7. The power-amplification circuit of claim 1, further including a plurality of signal processing circuits, wherein each of the plurality of signal processing circuits is located in between the output of one of the plurality of power amplifiers and the input of an associated one of the plurality of immittance converters.

8. The power-amplification circuit of claim 1, further including a plurality of signal processing circuits each of which is to provide signal matching between the output of one of the plurality of power amplifiers and the input of an associated one of the plurality of immittance converters.

9. The power-amplification circuit of claim 1, further including a control circuit to control at least one of the plurality of power amplifiers for coarsely setting a power-amplification level associated with energy delivered to the load circuitry, and to control a phase or timing delay associated with one of the plurality of power amplifiers or of the plurality of immittance converters for finely setting the power-amplification level associated with the energy delivered to the load circuitry.

10. The power-amplification circuit of claim 1, further including three or more in-parallel feed-forward paths, each including one of the plurality of power amplifiers and one of the plurality of immittance converters, and wherein power delivery to the load circuitry is set via at least one of the in-parallel feed-forward paths being disabled and signal phase or timing in another of the in-parallel feed-forward paths being controlled or delayed.

11. The power-amplification circuit of claim 10, further including a control circuit to set the power delivery to the load circuitry by disabling said at least one of the in-parallel feed-forward paths and controlling the signal phase or timing in the other of the in-parallel feed-forward paths.

12. The power-amplification circuit of claim 11, further including a feedback path providing a path from the load circuitry to the control circuit.

13. The power-amplification circuit of claim 1, wherein each of the plurality of immittance converters includes a circuit with one of the respective outputs of the plurality of immittance converters and with at least one capacitor and at least one inductor, each of said at least one capacitor and of said at least one inductor having a value set as a function of the load circuitry.

14. A method comprising:
using a plurality of power amplifiers in parallel to drive a plurality of immittance converters also in parallel, wherein each of the plurality of immittance converters has an input driven by an output of at least one of the plurality of power amplifiers; and
at an output node, combining current that is derived from output ports of the plurality of immittance converters and in response, delivering energy from the plurality of power amplifiers to load circuitry.

15. The method of claim 14, wherein at least one of the plurality of power amplifiers and at least one of the immittance converters receives an input signal respectively for coarse-power-level adjustment and less-than-coarse-power-level adjustment, for the delivering of energy to the load circuitry with the delivered energy switching between multiple power levels as set by the coarse-power-level adjustment and the less-than-coarse-power-level adjustment.

16. The method of claim 15, wherein the plurality of power amplifiers, the plurality of immittance converters and the load circuitry are used in one of the following: a plasma processing in a semiconductor manufacturing plasma processor where the switching energy is RF energy; and a magnetic imaging system.

17. The method of claim 14, wherein at least one of the plurality of power amplifiers and/or at least one of the immittance converters receives an input signal providing a power-level adjustment for the delivering of energy to the load circuitry with the delivered energy adjusted to compensate for a mismatched load level of the load circuitry.

18. The method of claim 14, wherein at least one of the plurality of power amplifiers and/or at least one of the immittance converters receives an input signal providing a power-level adjustment for the delivering of energy to the load circuitry with the delivered energy adjusted to dampen undesired subharmonic oscillation and to stabilize an RF signal in the delivered energy.

19. An apparatus comprising:
multiple in-parallel circuit paths, each of the multiple in-parallel circuit path including
a power amplifier to amplify a source signal, and
an immittance converter having an output node and to be driven by the power amplifier and to output current at the output node; and
circuitry to combine current from respective ones of the output nodes of the immittance converters for delivery of a combined current level to a load.

20. The apparatus of claim 19, further including a control circuit coupled to at least one of the multiple in-parallel circuit paths to modulate overall power delivery to the load by modulating at least one of:

a phase or signal-timing adjustment of the immittance converter of said at least one of the multiple in-parallel circuit paths for finely tuning overall power delivery to the load; and a coarse setting of one or more power amplifiers to affect delivery of power from said one or more of the power amplifiers for coarsely setting the overall power delivery to the load.

21. The power-amplification circuit of claim 1, further including a control circuit having an input port coupled to the load circuitry.

22. The power-amplification circuit of claim 1, further including three or more in-parallel feed-forward paths, each including one of the plurality of power amplifiers and one of the plurality of immittance converters.

* * * * *